United States Patent
Lin

(10) Patent No.: US 12,313,651 B2
(45) Date of Patent: May 27, 2025

(54) PROBE JOINT AND SPRING PROBE COMPRISING THE SAME

(71) Applicant: AZOTH STUDIO LTD. CO., Zhubei (TW)

(72) Inventor: Zhou Yi Lin, Zhubei (TW)

(73) Assignee: AZOTH STUDIO LTD. CO., Hsinchu (TW)

( * ) Notice: Subject to any disclaimer, the term of this patent is extended or adjusted under 35 U.S.C. 154(b) by 163 days.

(21) Appl. No.: 18/243,013

(22) Filed: Sep. 6, 2023

(65) Prior Publication Data
US 2024/0085458 A1 Mar. 14, 2024

(30) Foreign Application Priority Data
Sep. 13, 2022 (TW) .................... 111134566

(51) Int. Cl.
*G01R 1/067* (2006.01)

(52) U.S. Cl.
CPC ..... *G01R 1/06738* (2013.01); *G01R 1/06722* (2013.01); *G01R 1/06744* (2013.01); *G01R 1/06755* (2013.01)

(58) Field of Classification Search
CPC ............ G01R 1/06738; G01R 1/06722; G01R 1/06744; G01R 1/06755
See application file for complete search history.

(56) References Cited

U.S. PATENT DOCUMENTS

| | | | | |
|---|---|---|---|---|
| 5,518,410 A | * | 5/1996 | Masami ............. | H01R 13/2485 439/700 |
| 6,703,855 B1 | * | 3/2004 | Wu ........................ | H01R 11/18 324/755.05 |
| 2005/0151556 A1 | * | 7/2005 | Lee ...................... | G01R 1/06722 324/755.05 |
| 2008/0048701 A1 | * | 2/2008 | Henry ................ | G01R 1/06722 324/755.05 |
| 2008/0061809 A1 | * | 3/2008 | Lee ...................... | G01R 1/06722 324/755.05 |
| 2008/0116924 A1 | * | 5/2008 | Blaney ............... | G01R 1/06722 324/755.05 |
| 2015/0247882 A1 | * | 9/2015 | Lee ...................... | G01R 1/06722 324/755.05 |

* cited by examiner

*Primary Examiner* — Paresh Patel

(57) ABSTRACT

Provided are a probe joint including a micro-electromechanical probe head and a conductive member, and a spring probe including the same. The probe head includes a docking portion extending in a radial direction to form a deformable portion; and a contact portion for contacting an object to be tested, which is located at one end of the docking portion and has a size decreasing as away from the docking portion. The conductive member has a connecting section having an extended portion surrounding to define a carrier space; and a notch which communicates with the carrier space. When assembling, the docking portion can be disposed in the carrier space, the deformable portion extends out of the connecting section through the notch. The deformable portion can be deformed and forms a deformed portion, which partially wraps the extended portion, thereby preventing the probe head from being separated from the conductive member.

18 Claims, 16 Drawing Sheets

PROBE JOINT AND SPRING PROBE COMPRISING THE SAME

CROSS-REFERENCE TO RELATED APPLICATION

This application claims the priority of Taiwanese patent application No. 111134566, filed on Sep. 13, 2022, which is incorporated herewith by reference.

BACKGROUND OF THE INVENTION

1. Field of the Invention

The present invention relates to the technical field of a probe used for electrical testing, and in particular to a micro-electromechanical probe joint with low cost, short delivery time and easy production, which has good firmness after assembling and high current transmission, and a spring probe structure comprising the same.

2. The Prior Arts

After wafers have been produced through a semiconductor process, it is necessary to check whether the signal transmission can operate or be computed normally through electrical contact, so as to determine the quality of numerous dies. In general, in order to check whether the electrical connection of the die circuit is correct, or whether there is a problem in signal transmission, a probe is usually used as the testing interface between the testing device and the chip to be tested, thereby obtaining the testing result of the die to be tested through signal transmission and electrical signal analysis.

In some applications, the test of the probe device is not carried out on a planar structure, such as a contact pad, but on a three-dimensional contact structure, which has a ball shape of conductive material referred as a bump or a metal pillar (especially copper) referred as a boss, protruding from a surface of an object to be tested. For application in the above testing operations, a more preferred solution is to use a spring probe.

As shown in FIG. 1, which is a schematic diagram of a conventional spring probe, such as disclosed in patent application Ser. No. 10/914,3333. This spring probe is assembled by combining a probe head 91 and a plunger 92 at both end of a long tubular housing 90, respectively, and the probe head 91 can be fixed on the top of the housing 90, such that the plunger 92 can move linearly for a short distance but cannot be separated from the housing 90. The housing 90 is further provided with a spring 93 therein, and both ends of the spring 93 contact the probe head 91 and the plunger 92, respectively, for providing a cushioning elasticity during the contact. During testing, the plunger 92 contacts the circuit of the probe testing device, and the probe head 91 contacts an object to be tested, such as dies distributed in a wafer.

In the example of FIG. 1, the probe head 91 is manufactured by a micro-electromechanical process and has a structure comprising a contact portion 911, a first main body portion 912, a second main body portion 913 and a third main body portion 914, with the contact portion 911 being a protruding tip. However, such probe head 91 manufactured by a micro-electromechanical process is in a multi-layer planar stacked structure, which is formed by stacking vertically in sequence using semiconductor processes, but it must be stacked to a certain height to reduce the difficulty of assembly, so as to be beneficial to be combined with structures such as the metal housing 90, the spring 93, and the plunger 92 to form a spring probe. More specifically, multiple processes such as pattern transfer process, pattern development process, metal deposition process, grinding and planarization process, and etching process are needed for forming the structure of each portion of the probe head 91. In addition, because respective portions are different in thickness or height, it is necessary to repeat the above multiple processes to form one part by stacking several layers of planar structure. Therefore, it is difficult to meet the requirements for price and delivery time in the market because of the high cost and long production duration of the probe head manufactured by full micro-electromechanical technology. However, although the production cost and production duration can be reduced by reducing the number of planar structures of the micro-electromechanical probe head 91, the tiny probe head 91 must be further combined with structures such as the metal housing 90, the spring 93, and the plunger 92 to form a complete spring probe. With the miniaturization of the probe head 91, the difficulty of processing and assembly also increase, because in addition that the probe needs to have a contact end with high hardness manufactured by micro-electromechanical technology, it is also needed to maintain the firmness among the components during the testing operation of repeated electrical contact and electrical separation. Therefore, how to obtain a spring probe which has a micro-electromechanical probe head with a high life for testing, low production cost, short delivery time, and easy production is the focus in research and design of the present invention.

SUMMARY OF THE INVENTION

A main objective of the present invention is to provide a probe joint and a spring probe comprising the same, the probe joint is composed of a micro-electromechanical probe head and a conductive member, both of which can be manufactured simultaneously in optimal production mode, respectively, the components are subsequently fixed by riveting to complete the connection therebetween to ensure the firmness after assembly, which has the advantages of low production cost, short delivery time, and easy production overall in addition to the characteristic of high hardness of the micro-electromechanical probe head. After the spring probe is made, the components will not be separated from each other after the probe is used in the testing for a long term, which can meet the requirements of long lifespan for testing, good firmness, high current transmission effect and stability of low resistance.

To achieve the aforementioned objectives, the following technical solutions are adopted in the present invention:

The present invention provides a probe joint comprising a probe head and a conductive member, wherein the probe head includes at least one contact portion and at least one docking portion connected to each other, the probe head is manufactured by a micro-electromechanical process, the contact portion is located at one end of the docking portion and has a size decreasing in a direction away from the docking portion, the contact portion is used to contact an object to be tested, and the docking portion extends in a radial direction to form at least one deformable portion; the conductive member has a connecting section, the connecting section has at least one extended portion and at least one notch at one end thereof, the extended portion surrounds to define a carrier space, and the notch communicates with the carrier space; when assembling, the carrier space provides a space for the docking portion to be disposed therein, the deformable portion extends out of the connecting section through the notch; and when the deformable portion is pressed and deformed due to an external force, the deformable portion forms at least one deformed portion at the extended portion, and the deformed portion partially wraps at least a part of an outer peripheral surface of the extended portion, thereby preventing the probe head from being separated from the conductive member.

As one of the preferred embodiments, the docking portion has a hardness equal to or less than 500 Vickers hardness.

As one of the preferred implementations, the docking portion and the deformable portion each has a hardness less than or equal to that of the contact portion.

As one of the preferred embodiments, the contact portion has a height less than 525 microns, and the docking portion has a height less than 1000 microns.

As one of the preferred implementations, each of the docking portion and the deformable portion is made of a material having a conductivity equal to or greater than 30% of that of an international annealed copper standard.

As one of the preferred implementations, each of the docking portion and the deformable portion is made of a material comprising at least one of the following elements: copper (Cu), silver (Ag), gold (Au), carbon (C), platinum (Pt), palladium (Pd), tungsten (W), aluminum (Al), tin (Sn), rhodium (Rh), iridium (Ir), indium (In) and ruthenium (Ru).

As one of the preferred embodiments, at least a part of the deformable portion is beyond an outer periphery of the contact portion and an outer periphery of the notch.

As one of the preferred implementations, an radial size of a combination of the docking portion and the deformable portion is greater than that of a combination of the carrier space and the notch.

As one of the preferred implementations, the deformable portion has a width less than or equal to that of the notch.

As one of the preferred implementations, the at least one deformed portion has a number of two or more, and at least one of the two or more deformed portions has an area different from that of other of the two or more deformed portions.

As one of the preferred embodiments, the deformable portion further has at least one flange on an outer peripheral surface thereof, and when assembling, the flange partially surrounds the outer peripheral surface of the extended portion.

As one of the preferred embodiments, the conductive member can be made of a material including copper or copper alloy, and the copper alloy includes copper (Cu) and at least one alloying element selected from a group consisting of silver (Ag), gold (Au), carbon (C), platinum (Pt), palladium (Pd), tungsten (W), aluminum (Al), tin (Sn), rhodium (Rh), iridium (Ir), indium (In), boron (B), phosphorus (P), zinc (Zn), chromium (Cr) and ruthenium (Ru).

As one of the preferred embodiments, the at least one notch has a number of two or more, and at least one of the two or more notches has a width different from that of other of the two or more notches.

As one of the preferred embodiments, the at least one extended portion has a number of two or more, and at least one of the two or more extended portions has a shape different from that of other of the two or more extended portions.

The present invention also provides a spring probe structure comprising the probe joint, the connecting section of the probe joint further includes a first neck section, a second neck section and a third neck section at another section away from the carrier space, the second neck section is located between the first neck section and the third neck section and has a radial size less than that of each of the first neck section and the third neck section; a pipe, which has an accommodating space, and after the third neck section of the conductive member is inserted into the accommodating space, an external force can be applied to an outer wall of the pipe to form a catch portion on the pipe protruding toward inside of the pipe, and the catch portion is caught at the second neck section, thereby preventing the pipe from being separated from the conductive member; a movable plunger, which is disposed in the accommodating space of the pipe, and the movable plunger has a pin portion with a less size such that the pin portion can reach out of the pipe but the plunger is limited to be movable inside the pipe and prevented from being separated from the pipe; an elastic member which is a compressible spring, the elastic member is disposed in the accommodating space, and both ends of the elastic member contact the plunger and the probe head, respectively.

As one of the preferred embodiments, the connecting section has an outer diameter greater than or equal to an inner diameter of the pipe.

As one of the preferred embodiments, the third neck section has an outer diameter smaller than or equal to an inner diameter of the pipe.

As one of the preferred embodiments, the catch portion is partially fixed to at least a part of an outer peripheral surface of the second neck section.

Compared with the prior art, the present invention combines micro-electromechanical process technology and mechanical processing to produce a micro-electromechanical probe joint, wherein in addition that the probe joint has the characteristics of having contact portion with high hardness and connecting section with high conductivity, the most important thing is that in the case of mass production, compared with the probe head manufactured by the full micro-electromechanical process, the present invention reduces the number of layers of the structure manufactured by the micro-electromechanical process in the probe head, for example, a conventional micro-electromechanical probe head has four layer of this structure, while the micro-electromechanical probe head of the present invention has reduced the number of layers of this structure to two, which can shorten the production duration and production cost of the probe heads manufactured by the full micro-electromechanical technology. In addition, the conductive member is a solid cylinder manufactured by mechanical processing, so that the micro-electromechanical probe head having the docking portion can easily and quickly form a firm probe joint along with one end of the conductive member, which can improve the yield of assembling the probe head having reduced number of parts manufactured by micro-electromechanical process with the pipe. Further, another end of the conductive member can be riveted with the pipe by a conventional manner to form a spring probe with a micro-electromechanical probe joint. Although the micro-electromechanical probe joint of the present invention has increased cost of one conductive member, it also has greatly reduced production cost and production duration of the micro-electromechanical probe head, the cost of the conductive member is much lower than the production cost and time cost of the micro-electromechanical process, and the problem such as the poor assembly yield of the micro-electromechanical probe head with a less number of layers of the structure can be improved by such design of shape and structure of the probe head. In addition, the micro-electromechanical probe head and the conductive member can be manufactured simultaneously in the early-stage of the manufacturing process, respectively, thereby shortening the production duration. Subsequently, a micro-electromechanical probe joint with low production cost, short delivery time, and easy production can be formed by docking and riveting the micro-electromechanical probe head with the conductive member, thereby saving the production cost of the probe head manufactured by the full micro-electromechanical process. Thereafter, the micro-electromechanical probe joint and the pipe are combined to assemble a spring probe with a micro-electromechanical probe head, which has performance of high hardness, long lifespan for testing, high current transmission effect and stability of low resistance during testing, and can meet the current requirement for miniaturization of the probe.

DETAILED DESCRIPTION OF THE PREFERRED EMBODIMENT

Figure 1:
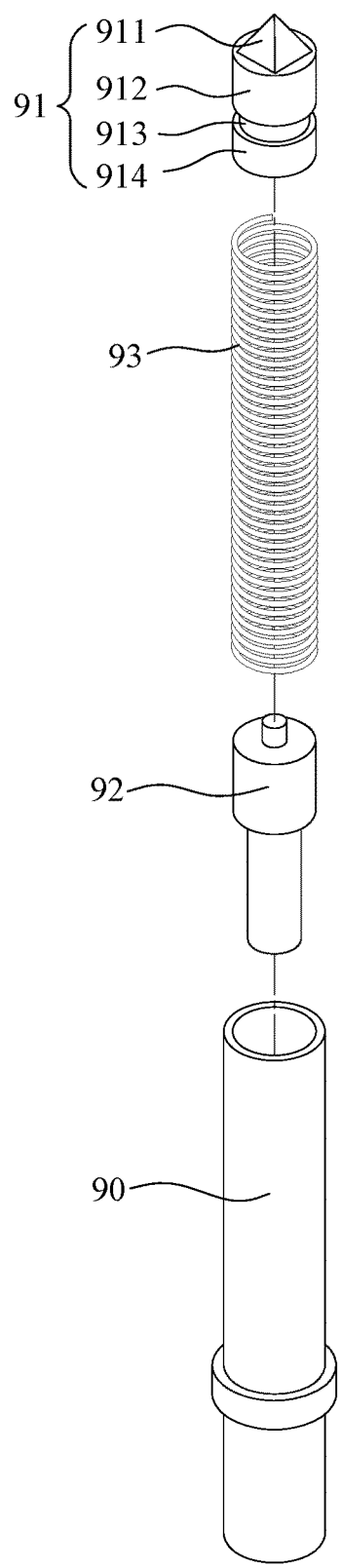
FIG. 1 is an exploded schematic diagram of a conventional spring probe.

The technical solutions of the present invention will be clearly and completely described below in conjunction with specific embodiments and accompanying drawings. It should be noted that when an element is referred to as being "mounted on or fixed on" another element, it means that it may be directly located on the other element or an intervening element can be presented. When an element is referred to as being "connected" to another element, it means that it may be directly connected to the other element or an intervening element can be presented. "Axial" refers to the direction of the central axis of the element. "Radial" refers to the direction perpendicular to the central axis of the element. In the illustrated embodiments, directions represented by up, down, left, right, front and rear, etc. are relative, and are used to explain that the structure and movement of different elements are relative in the present invention. These representations are appropriate when the components are located in the positions shown in the drawings. However, if the description of the position of elements changes, these representations are considered to change accordingly.

Unless otherwise defined, all technical and scientific terms used herein have the same meaning as commonly understood by those skilled in the art. The terms used herein is for the purpose of describing specific embodiments only but is not intended to limit the present invention. As used herein, the term "and/or" includes any and all combinations of one or more related listed items.

Figure 2:
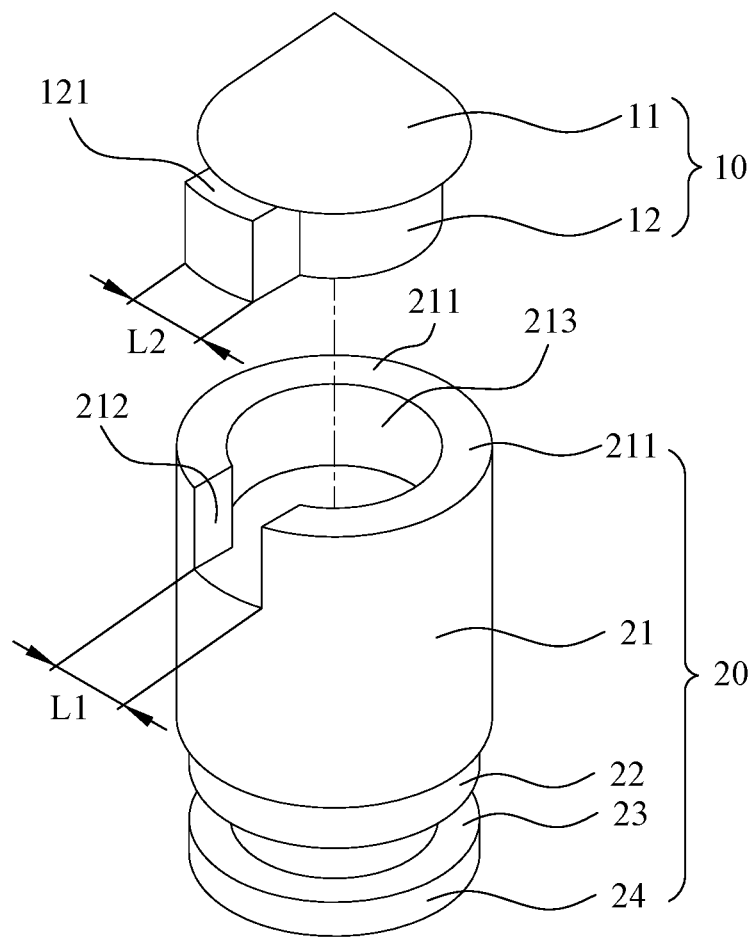
FIG. 2 is an exploded view of a first embodiment of the present invention.
Figure 3:
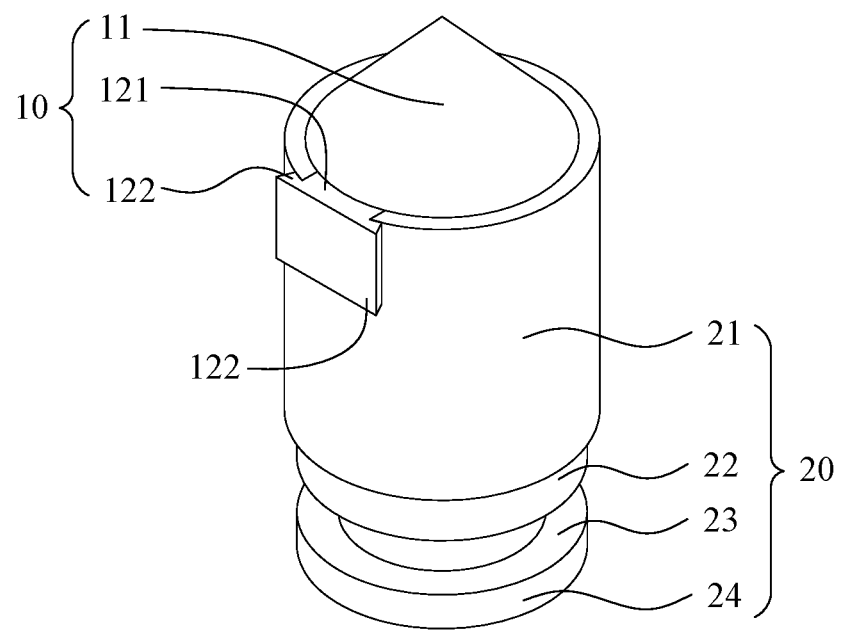
FIG. 3 is a perspective view of the first embodiment of the present invention after assembling.

As shown in FIG. 2 and FIG. 3, which are an exploded view and a perspective view after assembling of the first embodiment of the present invention, respectively. The present invention provides a probe joint comprising a probe head 10 and a conductive member 20, wherein the probe head 10 includes at least one contact portion 11 and at least one docking portion 12 connected to each other, the probe head 10 is manufactured by vertically stacking a plurality of layers of planar structures manufactured by a micro-electromechanical process. The contact portion 11 is located at one end of the docking portion 12 and has a size decreasing in a direction away from the docking portion 12. The contact portion 11 is used to contact an object to be tested. A deformable portion 121 is disposed at the periphery of the docking portion 12, and the deformable portion 121 extends radially outward from the docking portion 12. The conductive member 20 is in a column shape of conductive metal, and has a connecting section 21. The connecting section 21 has at least one extended portion 211 and at least one notch 212 at one end thereof. The extended portion 211 surrounds to define a carrier space 213. The notch 212 communicates with the carrier space 213. When assembling, the carrier space 213 provides a space for the docking portion 12 to be disposed therein, the deformable portion 121 extends out of the connecting section 21 through the notch 212. When the deformable portion 121 is pressed and deformed due to an external force, the deformable portion 121 forms at least one deformed portion 122 at the outer peripheral surface of the extended portion 211, and the deformed portion 122 partially wraps at least a part of an outer peripheral surface of the extended portion 211, thereby preventing the probe head 10 from being separated from the conductive member 20. The probe joint formed by this structure has a contact portion with high hardness manufactured by micro-electromechanical process, and a mechanically processed conductive member. More specifically, the number of planar structures produced by the micro-electromechanical process can be reduced, the production duration of the micro-electromechanical probe head can be shortened, and the structure is reinforced by a replacing mechanically processed conductive member. In the case of simultaneous production of the probe head and the conductive member, compared with the probe head that is manufactured by the full micro-electromechanical process, in the present invention, the probe head and the conductive member can be combined to assemble the probe joint after their rapid production, respectively, which can effectively improve production capacity, shorten delivery time and reduce production cost. In addition, the components still has the functional characteristics of the micro-electromechanical probe head after being riveted and are easy to be subsequently combined to assemble a spring probe structure.

Hereinafter, the structure of each component is described in detail:

The probe head 10 of the present invention includes a contact portion 11 and a docking portion 12 stacked in sequence, and is made of conductive material by micro-electromechanical systems (MEMS) process, wherein the contact portion 11 is firstly formed, then the docking portion 12 and the deformable portion 121 are integrally formed on the contact portion 11, and then the axial size of the docking portion 12 and the deformable portion 121 are controlled according to the molding time. In this process method, a predetermined pattern is firstly formed on the substrate by etching through a semiconductor process, then corresponding conductive materials are deposited in sequence, and finally, excess material are removed to form the structure of the probe head 10 of the present invention.

Figure 4A:
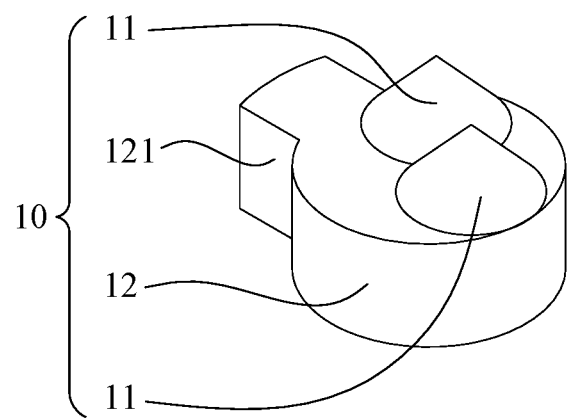
FIG. 4A is a view illustrating a contact portion of another embodiment of the present invention.
Figure 4B:
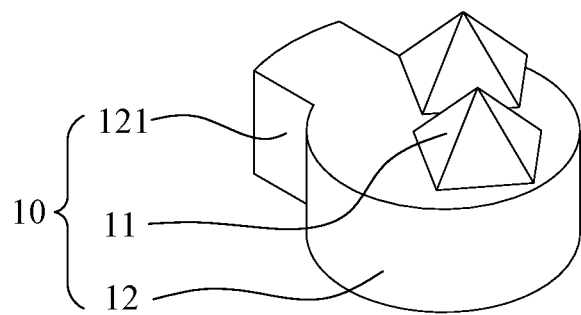
FIG. 4B is a view illustrating a contact portion of still another embodiment of the present invention.

Although the contact portion 11 and the docking portion 12 are both made of materials with good electrical conductivity, their materials do not need to be exactly the same. The contact portion 11 is responsible for repeatedly contacting the object to be tested during electrical testing, and is made of a relatively hard material with good wear resistance, such as nickel or nickel alloys, and the nickel alloy contains nickel and at least one alloying element selected from a group consisting of iron (Fe), tungsten (W), copper (Cu), boron (B), phosphorus (P), carbon (C), cobalt (Co), silver (Ag), manganese (Mn), palladium (Pd) and rhodium (Rh). The contact portion 11 has a shape with a size gradually decreasing in a direction away from the docking portion 12, and the shape can be conical, quadrilateral pyramid, or polygonal three-dimensional oblique cone. In addition, the contact portion 11 can also be made of palladium or palladium alloy materials with moderate wear resistance and low resistance, and the palladium alloy contains palladium (Pd) and at least one alloying element selected from a group consisting of nickel (Ni), copper (Cu), cobalt (Co), molybdenum (Mo), silver (Ag), Indium (In), manganese (Mn) and carbon (C). In this embodiment, the contact portion 11 is connected to the position where the docking portion 12 is located. When the docking portion 12 is located in the carrier space 213, the deformable portion 121 corresponds to the notch 212, and a part of the deformable portion 121 is beyond the notch 212, and the two are located at corresponding positions. In this embodiment, the contact portion 11 has a number of only one, but it is not limited thereto and the number can be plural, as shown in FIGS. 4A and 4B, wherein the contact portion 11 includes a plurality of cones in FIG. 4A, and the contact portion 11 is in the shape of a quadrilateral pyramid in FIG. 4B. When the contact portion 11 has a number of one or plural, the height thereof is less than 525 microns, and the maximum radial size of the tip thereof is less than 25 microns. In addition, when the contact portion 11 has a number of plural, the distance between them is at least 10 microns.

The docking portion 12 is made of a material having a conductivity equal to or greater than 30% of that of an international annealed copper standard (IACS), and the material includes a material of at least one of the following elements: copper (Cu), silver (Ag), gold (Au), carbon (C), platinum (Pt), palladium (Pd), tungsten (W), aluminum (Al), tin (Sn), rhodium (Rh), iridium (Ir), indium (In) and ruthenium (Ru). The docking portion 12 and the deformable portion 121 have a hardness equal to or less than that of the contact portion 11. In this embodiment, the docking portion 12 and the deformable portion 121 have a hardness equal to or less than 500 Vickers hardness. The docking portion 12 has a radial size less than 700 microns, and a height less than 1000 microns, for being mounted in the carrier space 213. The docking portion 12 has a circular or polygonal shape, and extends in a radial direction thereof to form at least one deformable portion 121. The deformable portion 121 protrudes from the docking portion 12, which facilitates the use of Automated Optical Inspection (AOI) for image recognition of graphic discrimination, and the use of an equipment to automatically pick and place objects, thereby the picking, placement, and alignment and docking of the probe head 10 can be performed more accurately and quickly, which meets the requirements of the present invention for automatic production.

The conductive member 20 is produced by mechanical processing, such as mechanical cutting to form the desired shape, which is the current process technology, and the well-developed process greatly reduces the production duration and cost. The conductive member 20 material can be copper or copper alloy, and the copper alloy includes copper (Cu) and at least one alloying element selected from a group consisting of silver (Ag), gold (Au), carbon (C), platinum (Pt), palladium (Pd), tungsten (W), aluminum (Al), tin (Sn), rhodium (Rh), iridium (Ir), indium (In), boron (B), phosphorus (P), zinc (Zn), chromium (Cr) and ruthenium (Ru). The conductive member 20 is a solid cylinder, and one end thereof corresponding to the probe head 10 has the extended portion 211 and the notch 212 communicated thereto. The extended portion 211 surrounds to define a carrier space 213. The space within the carrier space 213 corresponds to the shape of the docking portion 12, and allows the docking portion 12 to be disposed in the carrier space 213. The notch 212 has a width L1 greater than or equal to a width L2 of the deformable portion 121, and has a radial length smaller than that of the deformable portion 121. Therefore, after the deformable portion 121 is mounted at the notch 212, the protruding radial length is equal to or less than 50% of the radial size of the connecting section 21.

Figure 5:
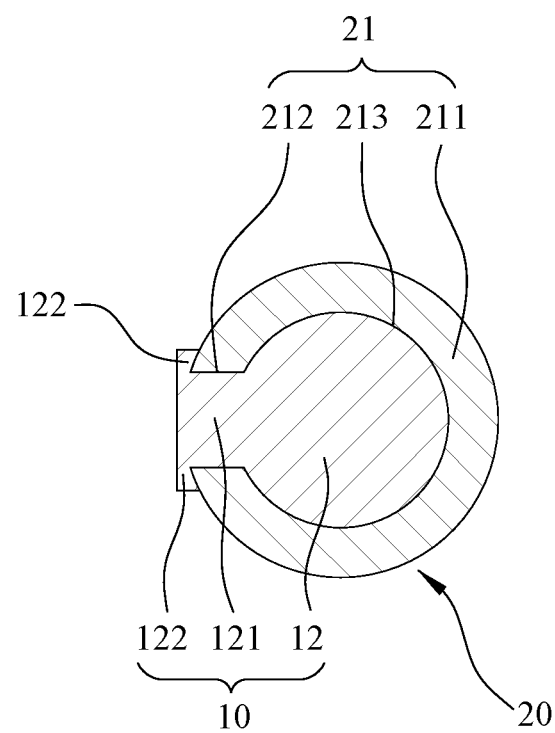
FIG. 5 is an enlarged cross-sectional view of the first embodiment of the present invention.

The key point of design of the present invention is to combine the conductive member 20 which can be made by mechanical processing and the probe head 10 made by micro-electromechanical system to assemble a probe joint, so that the thickness of the probe head 10 can be reduced to save the production duration and costs required for the micro-electromechanical processes. In addition, the conductive member 20 which can be simply and quickly processed and has low cost is adopted, a probe joint having a micro-electromechanical probe head is formed after the probe head 10 and the conductive member 20 are riveted and docked with each other. This micro-electromechanical probe joint has the advantages of low production cost, short delivery time, and easy production to assemble a spring probe, has the performance of high hardness, long lifespan for testing, high current transmission effect and stability of low resistance during testing, and can meet the current requirement for miniaturization of the probe. As shown in FIG. 5, when assembling and docking, the docking portion 12 is placed in the carrier space 213, and the deformable portion 121 extends out through the notch 212. By applying an external force with a mechanical assistance, for example, clamping by mechanical vice, when the deformable portion 121 is pressed by the external force, the deformable portion 121 forms at least one deformed portion 122 at the extended portion 211. The deformed portion 122 is a portion of the deformable portion 121 that extends to partially wrap at least a part of an outer peripheral surface of the extended portion 211, so that a good riveting effect between the two can be achieved. In addition, when the at least one deformed portion 122 has a number of two or more, at least one of the two or more deformed portions 122 has an area different from that of other of the two or more deformed portions 122.

Figure 6A:
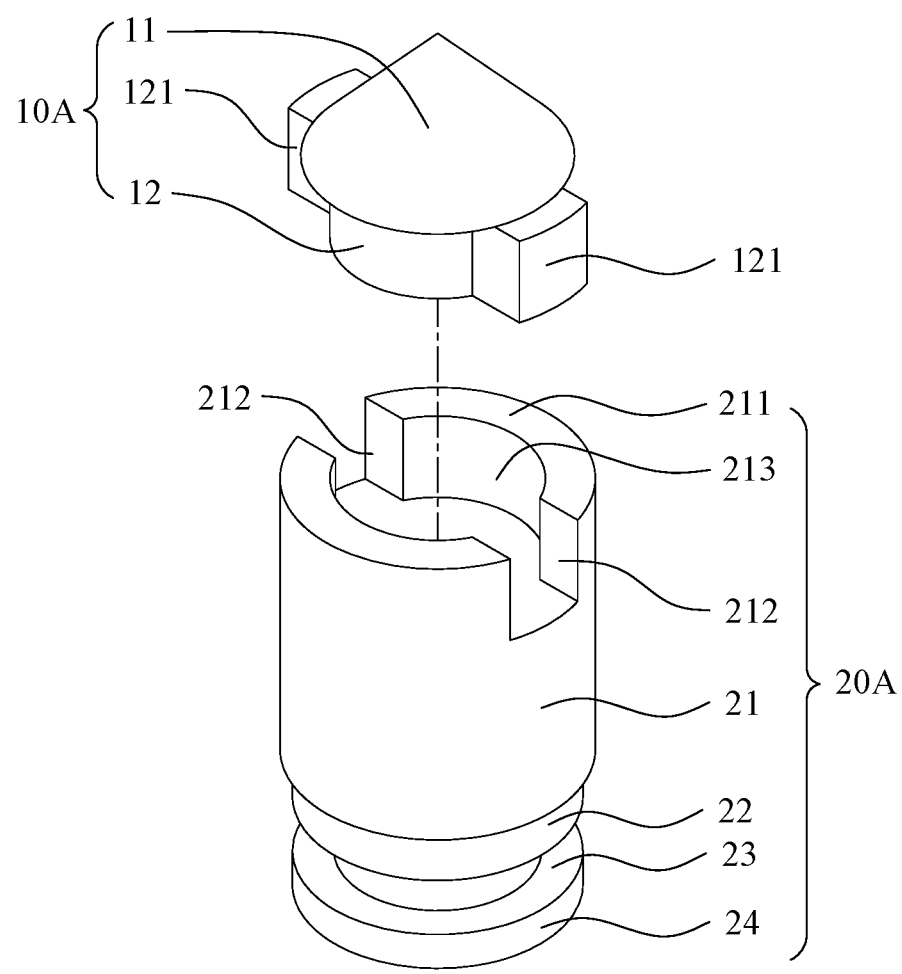
FIG. 6A is an exploded view of a second embodiment of the present invention.
Figure 6B:
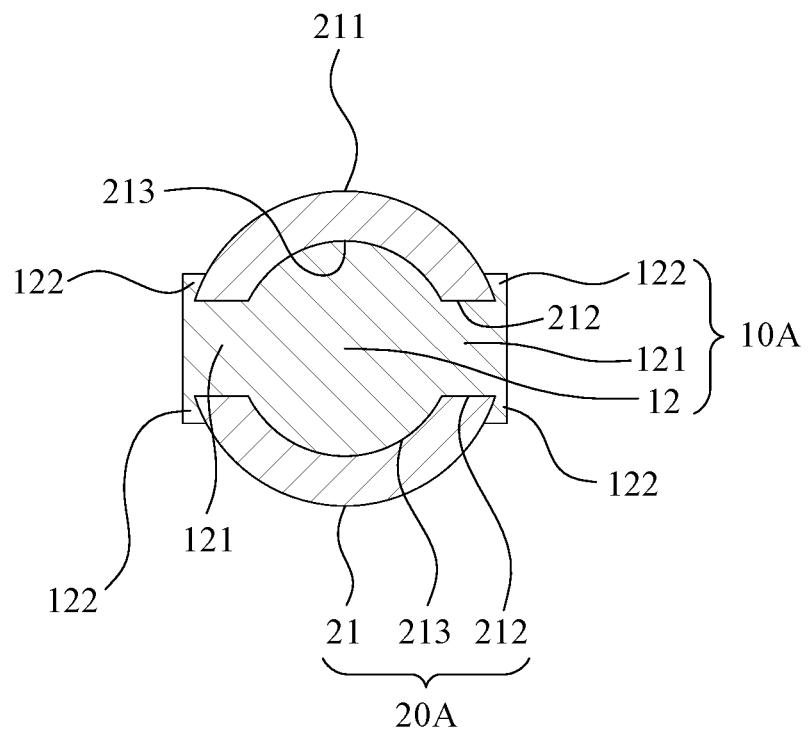
FIG. 6B is a schematic cross-sectional view of the second embodiment of the present invention.

In the above embodiment, the probe joint of the present invention is formed by matching one deformable portion 121 of the probe head 10 with one notch 212 of the conductive member 20, but it is not limited thereto, and a variety of different embodiments will be listed below for illustration:

As shown in FIG. 6A, which is an exploded view of the second embodiment of the present invention, in this embodiment, the probe joint is still composed of a probe head 10A and a conductive member 20A, but the probe head 10A is composed of the contact portion 11, the docking portion 12, and two deformable portions 121 radially extending from the docking portion 12. The connecting section 21 of the conductive member 20A has the carrier space 213 and two notches 212 communicated thereto, wherein both the two deformable portions 121 and the two notches 212 are arranged at intervals of 180 degrees, and their positions correspond to each other. As shown in FIG. 6B, when the probe head 10A is disposed at the conductive member 20A, the two deformable portions 121 respectively extend out through the notches 212 at different positions. After applying external force with mechanical assistance, a plurality of deformed portions 122 are formed to increase the area of the deformed portion 122 wrapping the extended portion 211, and to wrap a part of the outer peripheral surface of the extended portion 211 in different positions, thereby achieving better firmness.

Figure 7:
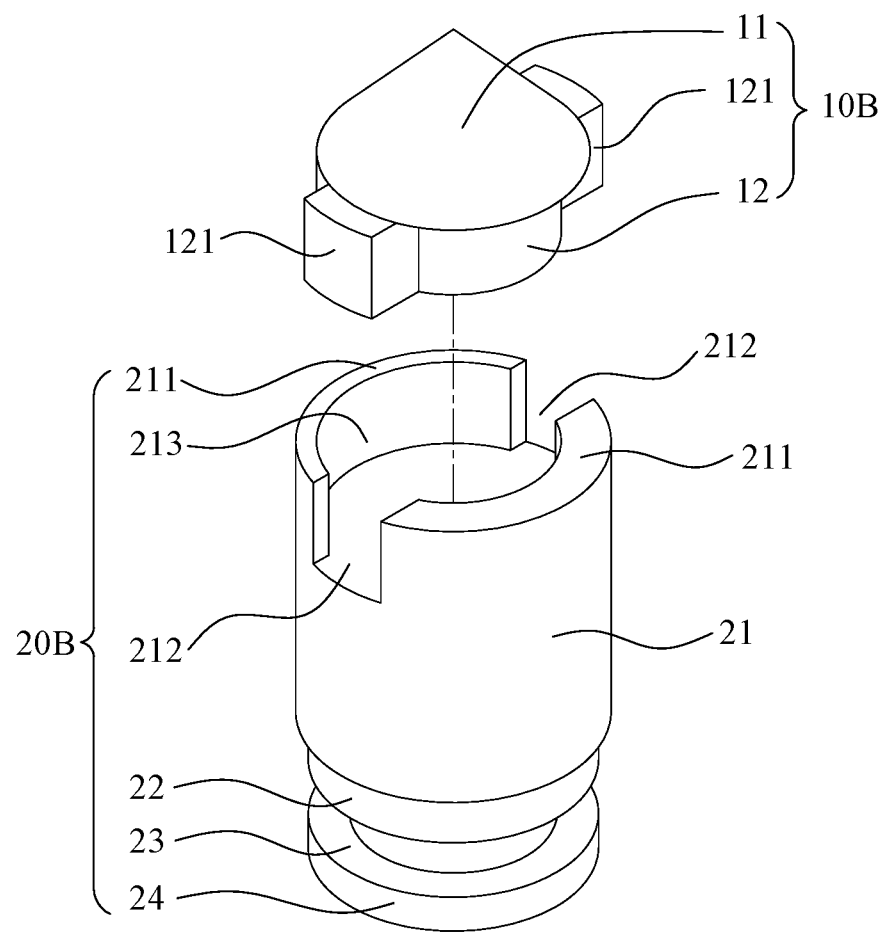
FIG. 7 is an exploded view of a third embodiment of the present invention.

As shown in FIG. 7, which is an exploded view of the third embodiment of the present invention. In the above second embodiment, the radial distances between the inner wall of the carrier space 213 and the outer wall of the connecting section 21 are all the same, but it is not limited thereto. In this embodiment, the radial distances between the inner wall of the carrier space 213 and the outer wall of the connecting section 21 are not the same in some positions, for example, with the two notches 212 as the boundary, the wall thicknesses on both sides of the notches 212 are not the same, which does not affect the docking of the probe head 10B with the conductive member 20B. However, due to an asymmetric shape of the conductive member 20B, the angle and position of the conductive member 20B can be identified using optical images, and automatically picking and placing and positioning can be achieved with a mechanical arm, which is more accurate and faster in assembly and production.

Figure 8:
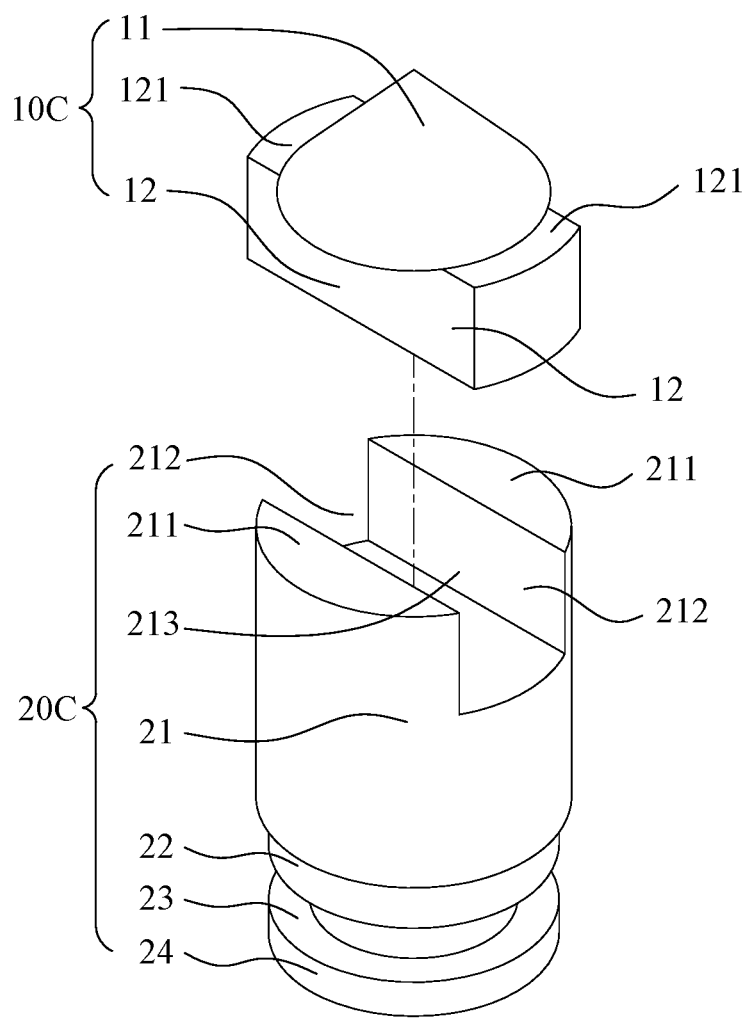
FIG. 8 is an exploded view of a fourth embodiment of the present invention.

As shown in FIG. 8, which is an exploded view of the fourth embodiment of the present invention. In this embodiment, the probe joint is composed of a probe head 10C and a conductive member 20C, but the docking portion 12 and the two deformable portions 121 extending radially therefrom all have the same width, so that the overall shape is a long strip. Correspondingly, the carrier space 213 of the connecting section 21 and the two notches 212 communicated thereto also have the same width, and the docking portion 12 and the deformable portion 121 have a width less than or equal to those of the carrier space 213 and the notch 212, and can be disposed in the carrier space 213. In addition, the radial length of a combination of the docking portion 12 and the deformable portion 121 is greater than that of a combination of the carrier space 213 and the notch 212. This method allows the conductive member 20C to be more convenient and faster in production and processing and have lower cost due to its simple structure.

Figure 9:
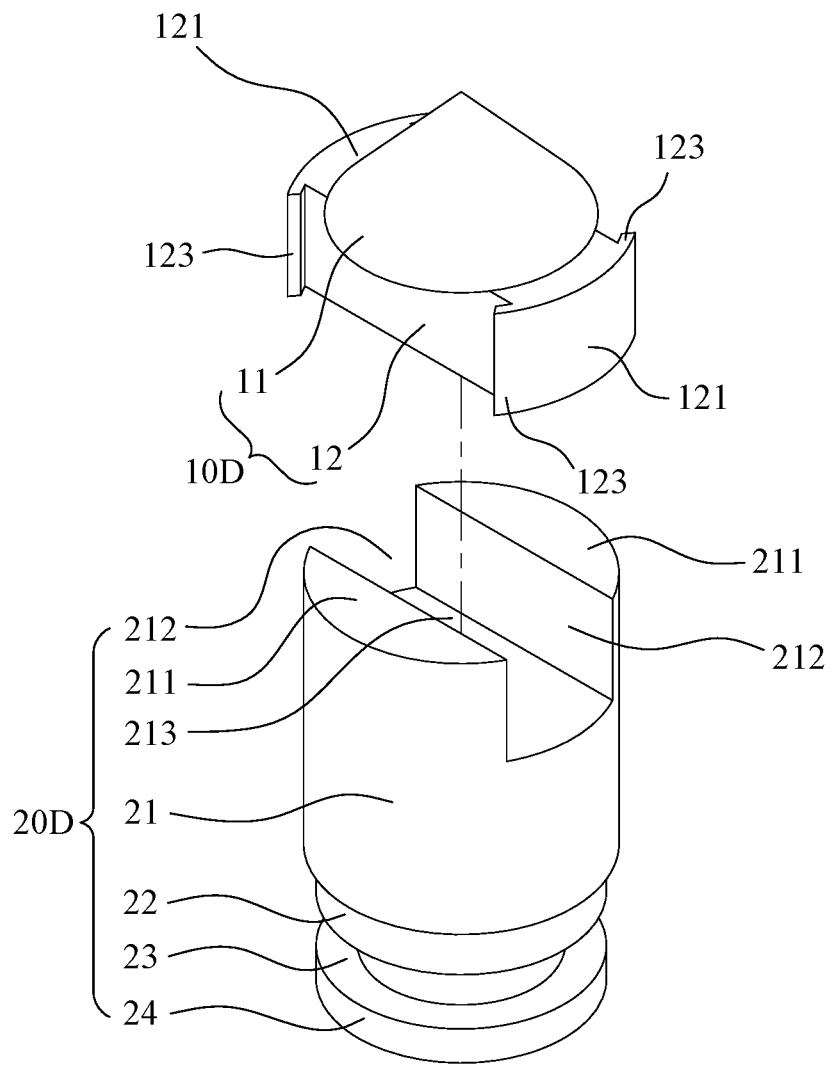
FIG. 9 is an exploded view of a fifth embodiment of the present invention.

As shown in FIG. 9, which is an exploded view of the fifth embodiment of the present invention. The structure of the fifth embodiment is similar to that of the fourth embodiment, except for the shape of a probe head 10D. In this embodiment, the deformable portion 121 further has at least one flange 123 on the side wall of the end away from the docking portion 12, and after assembly, the flange 123 partially surrounds the outer peripheral surface of the extended portion 211 and is easy to be pressed to form the deformed portion 122. When the probe head 10D is axially disposed to the conductive member 20D, since the flanges 123 are provided arranged at intervals of 180 degrees, the range of rotation and movement of both becomes smaller. During the subsequent pressing, the flange 123 is easy to form the deformed portion 122 to wrap at least a part of the outer peripheral surface of the extended portion 211, thereby achieving better firmness. In addition, the structure of the flange 123 of this embodiment can be widely applied in various embodiments.

Figure 10:
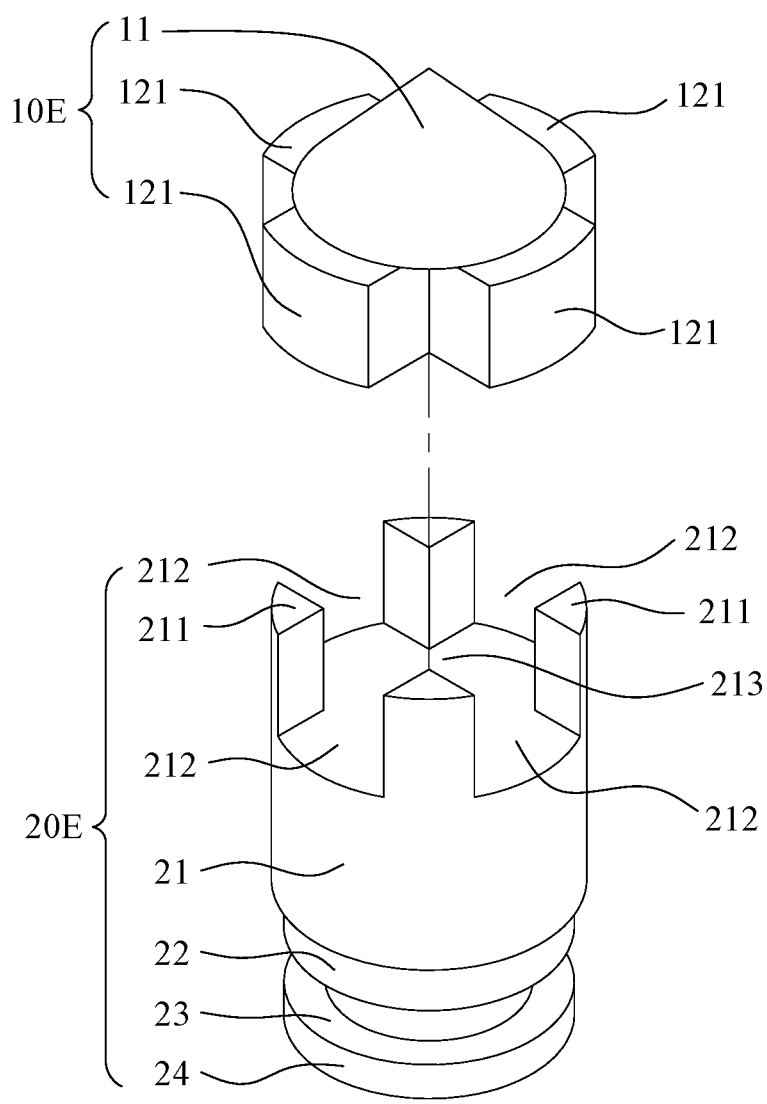
FIG. 10 is an exploded view of a sixth embodiment of the present invention.

As shown in FIG. 10, which is an exploded view of the sixth embodiment of the present invention. In this embodiment, the probe joint is still composed of a probe head 10E and a conductive member 20E, and the probe head 10E includes the contact portion 11, the docking portion 12, and four deformable portions 121 radially extending from the docking portion 12, while the connecting section 21 of the conductive member 20E is composed of the carrier space 213 and the four notches 212 communicated thereto, wherein both the deformable portions 121 and the notches 212 are disposed apart from the adjacent deformable portion 121 and notch 212 by 90 degrees, respectively. After mechanical riveting, more deformed portions 122 partially wrap at least a part of the outer peripheral surface of the extended portion 211, which can strengthen the firmness between the probe head 10E and the conductive member 20E.

Figure 11:
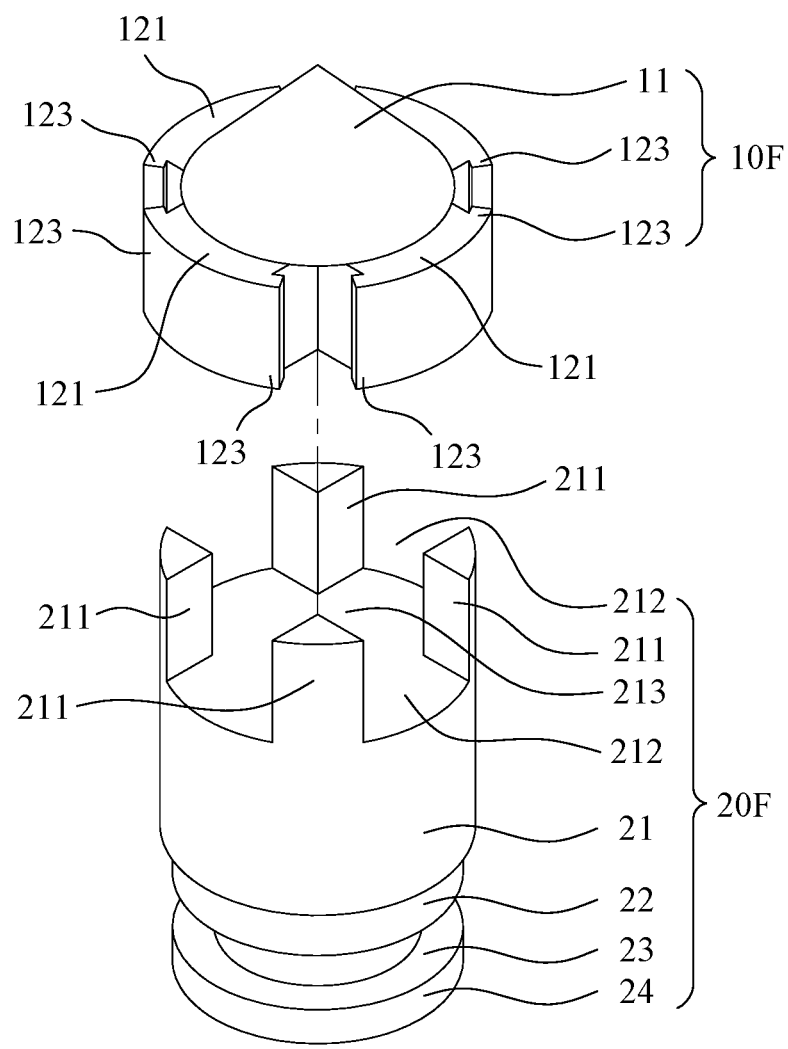
FIG. 11 is an exploded view of a seventh embodiment of the present invention.

As shown in FIG. 11, which is an exploded view of the seventh embodiment of the present invention. The structure of the seventh embodiment is similar to that of the sixth embodiment, except that the deformable portion 121 has at least one flange 123 on the side wall of the end away from the docking portion 12. When assembling, the flange 123 partially surrounds the outer peripheral surface of the extended portion 211 and is easy to be pressed to form the deformed portion 122. When a plurality of flanges 123 are pressed to form more deformed portions 122, not only the firm effect between the probe head 10F and the conductive member 20F can be strengthened, but also the yield of the riveting process can be improved.

Figure 12:
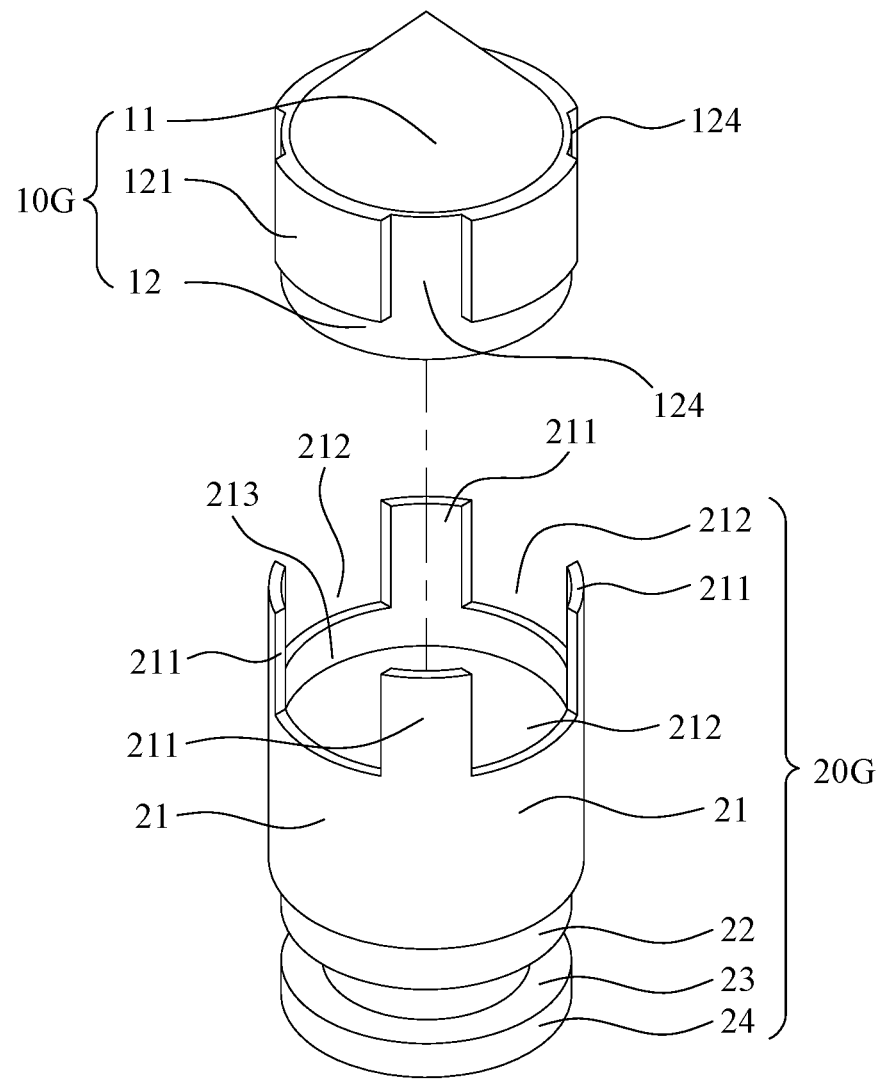
FIG. 12 is an exploded view of a eighth embodiment of the present invention.

As shown in FIG. 12, which is an exploded view of the eighth embodiment of the present invention. In this embodiment, the probe joint is still composed of a probe head 10G and a conductive member 20G, but the docking portion 12 has an axial length greater than that of the deformable portion 121, and a docking area 124 with a smaller radial size is formed between two adjacent deformable portions 121. The carrier space 213 of the conductive member 20G surrounded by a plurality of extended portions 211 is deeper and corresponds to the docking portion 12, and the notch 212 communicates with the carrier space 213. After assembling, the deformable portion 121 can also extend out of the notch 212, and when the deformable portion 121 is forced and deformed, the deformable portion 121 forms the deformed portion 122 to wrap at least a part of the outer peripheral surface of the extended portion 211.

In the above embodiments, when the notch 212 and the extended portion 211 each has a number of plural, their shapes are mostly the same, but the present invention is not limited thereto. For example, the notch 212 has a number of two or more, and at least one of the two or more notches 212 has a width different from that of other of the two or more notches 212. Similarly, the extended portion 211 has a number of two or more, and at least one of the two or more extended portions 211 has a shape different from that of other of the two or more extended portions 211.

Figure 13:
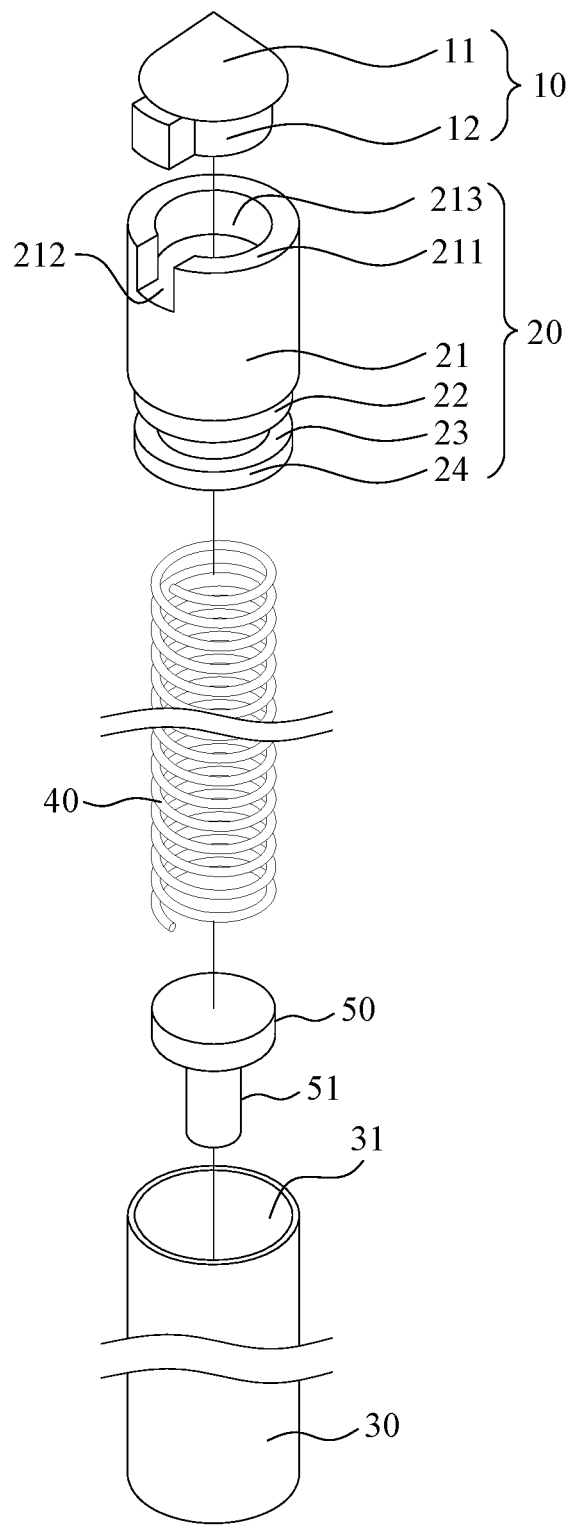
FIG. 13 is a perspective view of the present invention applied to a spring probe.

As shown in FIG. 13, which is an exploded view of the probe joint of the present invention applied to a spring probe structure, wherein the spring probe includes the probe head 10, the conductive member 20, a pipe 30, an elastic member 40 and a movable plunger 50. The combination manner of the probe head 10 and the conductive member 20 is as described in the above embodiments, so it will not be described in detail below, and the structure of other components are described thereafter: the connecting section 21 of the conductive member 20 further includes a first neck section 22, a second neck section 23 and a third neck section 24 at another section away from the carrier space 213; the second neck section 23 is located between the first neck section 22 and the third neck section 24 and has a radial size less than that of each of the first neck section 22 and the third neck section 24; the pipe 30 is a hollow pipe with an accommodating space 31, the accommodating space 31 provides a space for the plunger 50 to be inserted therein, and the plunger 50 has a pin portion 51 with a less size such that the pin portion 51 can reach out of the pipe 30, but the plunger 50 is limited to be only movable inside the pipe 30 and prevented from being separated from the accommodating space 31 from bottom; the elastic member 40 is a compressible spring, when the elastic member 40 is disposed in the accommodating space 31, both ends of the elastic member 40 contact the plunger 50 and the conductive member 20, respectively.

Figure 14:
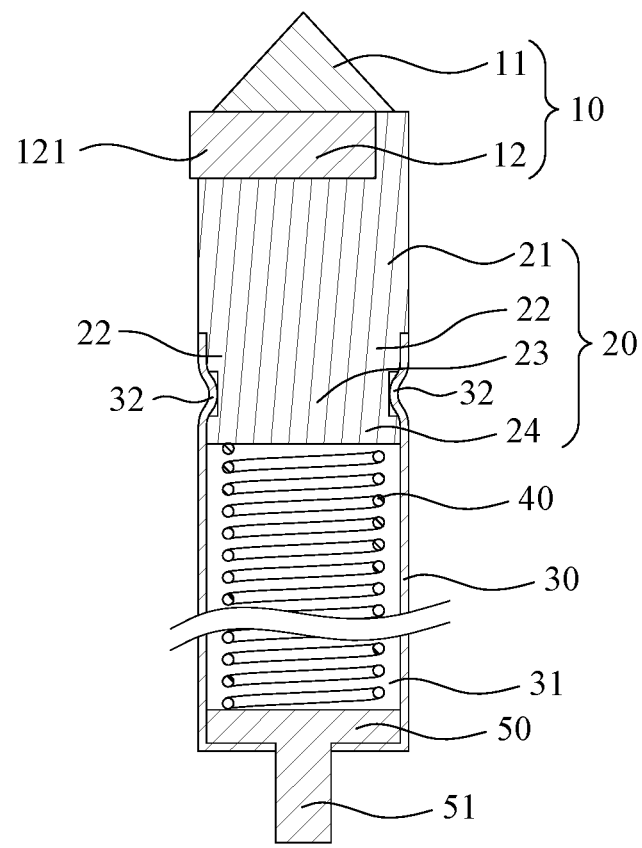
FIG. 14 is a schematic cross-sectional view of the present invention applied to a spring probe.

Please also refer to FIG. 14, when assembling, the plunger 50 is firstly inserted into the accommodating space 31 of the pipe 30 in a direction from top to bottom, and then the elastic member 40 is also inserted into the accommodating space 31 in the direction from top to bottom. The probe head 10 can be riveted and docked with the conductive member 20 in advance, then the third neck section 24 is inserted into the accommodating space 31, and then an external force is applied to the outer wall of the pipe 30 to form a catch portion 32 on the pipe 30 protruding toward inside of the pipe 30. The catch portion 32 is caught at the second neck section 23, thereby preventing the pipe 30 from being separated from the conductive member 20, and at the same time, all components are restrained by each other and stay together to form the spring probe. During testing, a plurality of the spring probes are mounted on a test platform (not shown), at both ends thereof, the probe head 10 contacts an object to be tested, and the plunger 50 is electrically connected to the corresponding circuit on the circuit board, respectively to carry out the required testing operations. Each of the above embodiments is applied to this structure, and thus will not be described one by one.

Furthermore, in the above embodiments, the connecting section 21 has an outer diameter greater than or equal to an inner diameter of the pipe 30, and the third neck section 24 has an outer diameter smaller than or equal to an inner diameter of the pipe 30. As such, a probe assembly with the same or similar outer diameter is formed after docking the pipe 30 with the conductive member 20, so that when assembling the probe testing device, the distance between each probe can the same or can be accurately controlled.

In summary, the present invention combines micro-electromechanical process technology and mechanical processing to produce a micro-electromechanical probe joint, wherein in addition that the probe joint has the characteristics of having contact portion with high hardness and connecting section with high conductivity, the most important thing is that in the case of mass production, compared with the probe head manufactured by the full micro-electromechanical process, the present invention reduces the number of layers of the structure manufactured by the micro-electromechanical process in the probe head, for example, a conventional micro-electromechanical probe head has four layer of this structure, while the micro-electromechanical probe head of the present invention has reduced the number of layers of this structure to two, which can shorten the production duration and production cost of the probe heads manufactured by the full micro-electromechanical technology. In addition, the conductive member is a solid cylinder manufactured by mechanical processing, so that the micro-electromechanical probe head having the structural shape design of the docking portion can easily and quickly form a firm probe joint along with one end of the conductive member, which can improve the yield of assembling the probe head having reduced number of parts manufactured by micro-electromechanical process with the pipe. Further, another end of the conductive member can be riveted with the pipe to form a spring probe with a micro-electromechanical probe joint. Although the micro-electromechanical probe joint of the present invention has increased cost of one conductive member, it also has greatly reduced production cost and production duration of the full micro-electromechanical probe head, the cost of the conductive member is much lower than the production cost and time cost of the micro-electromechanical process, and the problem such as the poor assembly yield of the micro-electromechanical probe head with a less number of layers of the structure can be improved. In addition, the micro-electromechanical probe head and the conductive member can be manufactured simultaneously in the early-stage of the manufacturing process, respectively, thereby shortening the production duration. Subsequently, a micro-electromechanical probe joint with low production cost, short delivery time, and easy production can be formed by docking and riveting the micro-electromechanical probe head with the conductive member, thereby saving the production cost of the probe head. Thereafter, the micro-electromechanical probe joint and the pipe are combined to assemble a spring probe with a micro-electromechanical probe head, which has performance of high hardness, long lifespan for testing, high current transmission effect and stability of low resistance during testing, and can meet the current requirement for miniaturization of the probe.

The above described are only preferred embodiments of the present invention, and are not intended to limit the scope of the embodiments of the present invention. That is, all equivalent changes and modifications made according to the claims of the present invention are covered by the claimed scope of the present invention.

What is claimed is:

1. A probe joint comprising a probe head and a conductive member, wherein the probe head includes at least one contact portion and at least one docking portion connected to each other, the probe head is manufactured by a micro-electromechanical process, the contact portion is located at one end of the docking portion and has a size decreasing in a direction away from the docking portion, the contact portion is used to contact an object to be tested, and the docking portion extends in a radial direction to form at least one deformable portion; the conductive member has a connecting section, the connecting section has at least one extended portion and at least one notch at one end thereof, the extended portion surrounds to define a carrier space, and the notch communicates with the carrier space; when assembling, the carrier space provides a space for the docking portion to be disposed therein, the deformable portion extends out of the connecting section through the notch; and when the deformable portion is pressed and deformed due to an external force, the deformable portion forms at least one deformed portion at the extended portion, and the deformed portion partially wraps at least a part of an outer peripheral surface of the extended portion, thereby preventing the probe head from being separated from the conductive member.

2. The probe joint according to claim 1, wherein the docking portion has a hardness equal to or less than 500 Vickers hardness.

3. The probe joint according to claim 1, wherein the docking portion and the deformable portion each has a hardness less than or equal to that of the contact portion.

4. The probe joint according to claim 1, wherein the contact portion has a height less than 525 microns, and the docking portion has a height less than 1000 microns.

5. The probe joint according to claim 1, wherein each of the docking portion and the deformable portion is made of a material having a conductivity equal to or greater than 30% of that of an international annealed copper standard.

6. The probe joint according to claim 5, wherein each of the docking portion and the deformable portion is made of a material comprising at least one of the following elements: copper (Cu), silver (Ag), gold (Au), carbon (C), platinum (Pt), palladium (Pd), tungsten (W), aluminum (Al), tin (Sn), rhodium (Rh), iridium (Ir), indium (In) and ruthenium (Ru).

7. The probe joint according to claim 1, wherein at least a part of the deformable portion is beyond an outer periphery of the contact portion and an outer periphery of the notch.

8. The probe joint according to claim 1, wherein an radial size of a combination of the docking portion and the deformable portion is greater than that of a combination of the carrier space and the notch.

9. The probe joint according to claim 1, wherein the deformable portion has a width less than or equal to that of the notch.

10. The probe joint according to claim 1, wherein the at least one deformed portion has a number of two or more, and at least one of the two or more deformed portions has an area different from that of other of the two or more deformed portions.

11. The probe joint according to claim 1, wherein the deformable portion further has at least one flange on an outer peripheral surface thereof, and the flange partially surrounds the outer peripheral surface of the extended portion.

12. The probe joint according to claim 1, wherein the conductive member is made of a material including copper or copper alloy, and the copper alloy includes copper (Cu) and at least one alloying element selected from a group consisting of silver (Ag), gold (Au), carbon (C), platinum (Pt), palladium (Pd), tungsten (W), aluminum (Al), tin (Sn), rhodium (Rh), iridium (Ir), indium (In), boron (B), phosphorus (P), zinc (Zn), chromium (Cr) and ruthenium (Ru).

13. The probe joint according to claim 1, wherein the at least one extended portion has a number of two or more, and at least one of the two or more extended portions has a shape different from that of other of the two or more extended portions.

14. The probe joint according to claim 1, wherein the at least one notch has a number of two or more, and at least one of the two or more notches has a width different from that of other of the two or more notches.

15. A spring probe structure, comprising:
a probe joint including a probe head and a conductive member, wherein the probe head includes at least one contact portion and at least one docking portion connected to each other, the probe head is manufactured by a micro-electromechanical process, the contact portion is located at one end of the docking portion and has a size decreasing in a direction away from the docking portion, the contact portion is used to contact an object to be tested, and the docking portion extends in a radial direction to form at least one deformable portion; the conductive member has a connecting section, the connecting section has at least one extended portion and at least one notch at one end thereof, the extended portion surrounds to define a carrier space, and the notch communicates with the carrier space; when assembling, the carrier space provides a space for the docking portion to be disposed therein, the deformable portion extends out of the connecting section through the notch; and when the deformable portion is pressed and deformed due to an external force, the deformable portion forms at least one deformed portion at the extended portion, and the deformed portion partially wraps at least a part of an outer peripheral surface of the extended portion, thereby preventing the probe head from being separated from the conductive member, wherein the connecting section further includes a first neck section, a second neck section and a third neck section at another section away from the carrier space, the second neck section is located between the first neck section and the third neck section and has a radial size less than that of each of the first neck section and the third neck section;
a pipe, which has an accommodating space, and after the third neck section of the conductive member is inserted into the accommodating space, an external force can be applied to an outer wall of the pipe to form a catch portion on the pipe protruding toward inside of the pipe, and the catch portion is caught at the second neck section, thereby preventing the pipe from being separated from the conductive member;
a movable plunger, which is disposed in the accommodating space of the pipe, and the movable plunger has a pin portion with a less size such that the pin portion can reach out of the pipe but the plunger is limited to be movable inside the pipe and prevented from being separated from the pipe; and
an elastic member which is a compressible spring, the elastic member is disposed in the accommodating space, and both ends of the elastic member contact the plunger and the probe head, respectively.

16. The spring probe structure according to claim 15, wherein the connecting section has an outer diameter greater than or equal to an inner diameter of the pipe.

17. The spring probe structure according to claim 15, wherein the third neck section has an outer diameter smaller than or equal to an inner diameter of the pipe.

18. The spring probe structure according to claim 15, wherein the catch portion is partially fixed to at least a part of an outer peripheral surface of the second neck section.

* * * * *